(12) United States Patent
Yamaga

(10) Patent No.: US 9,790,597 B2
(45) Date of Patent: Oct. 17, 2017

(54) SUBSTRATE PROCESSING APPARATUS, SUBSTRATE PROCESSING METHOD AND STORAGE MEDIUM

(71) Applicant: TOKYO ELECTRON LIMITED, Tokyo (JP)

(72) Inventor: Kenichi Yamaga, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/423,065

(22) Filed: Feb. 2, 2017

(65) Prior Publication Data

US 2017/0226639 A1 Aug. 10, 2017

(30) Foreign Application Priority Data

Feb. 5, 2016 (JP) .................................. 2016-021211

(51) Int. Cl.
*H01L 21/00* (2006.01)
*C23C 16/48* (2006.01)
(Continued)

(52) U.S. Cl.
CPC ........ *C23C 16/481* (2013.01); *C23C 16/4584* (2013.01); *C23C 16/45544* (2013.01);
(Continued)

(58) Field of Classification Search
CPC ... C23C 16/481; C23C 16/4584; C23C 16/46; C23C 16/52; C23C 16/45544;
(Continued)

(56) References Cited

U.S. PATENT DOCUMENTS

| 4,886,570 A * | 12/1989 | Davis ................... C23C 16/482 |
| | | 118/50.1 |
| 5,980,194 A * | 11/1999 | Freerks ............. H01L 21/67259 |
| | | 318/640 |
| 6,188,050 B1 * | 2/2001 | Duffer .................... G01K 11/22 |
| | | 219/494 |

FOREIGN PATENT DOCUMENTS

| JP | 2010-245448 A | 10/2010 |
| JP | 2014-017331 A | 1/2014 |

(Continued)

*Primary Examiner* — Richard Booth
(74) *Attorney, Agent, or Firm* — Nath, Goldberg & Meyer; Jerald L. Meyer

(57) ABSTRACT

A substrate processing apparatus that performs a film formation process on a substrate placed on one side of a rotary table includes: a main heating mechanism configured to heat the substrate; an auxiliary heating mechanism configured to adjust an intensity of light irradiated from the auxiliary heating mechanism in an inward/outward direction of the rotary table; a temperature measurement part configured to detect a temperature distribution of the substrate in the inward/outward direction of the rotary table; a position detection part configured to detect a position of the rotary table in a rotational direction of the rotary table; and a control part configured to control the intensity of the light irradiated from the auxiliary heating mechanism based on a temperature measurement data obtained by the temperature measurement part, a data corresponding to a target temperature distribution of the substrate, and a position detection value detected by the position detection part.

10 Claims, 12 Drawing Sheets

(51) Int. Cl.
*H01L 21/02* (2006.01)
*H01L 21/67* (2006.01)
*C23C 16/458* (2006.01)
*C23C 16/46* (2006.01)
*C23C 16/52* (2006.01)
*C23C 16/455* (2006.01)

(52) U.S. Cl.
CPC .............. *C23C 16/46* (2013.01); *C23C 16/52* (2013.01); *H01L 21/0228* (2013.01); *H01L 21/02164* (2013.01); *H01L 21/02186* (2013.01); *H01L 21/02277* (2013.01); *H01L 21/67248* (2013.01); *H01L 21/67259* (2013.01)

(58) Field of Classification Search
CPC ........... H01L 21/0228; H01L 21/02277; H01L 21/02164; H01L 21/02186; H01L 21/67259; H01L 21/67248
See application file for complete search history.

(56) References Cited

FOREIGN PATENT DOCUMENTS

| | | |
|---|---|---|
| JP | 2014-022653 A | 2/2014 |
| JP | 2014-138076 A | 7/2014 |
| JP | 2015-070095 A | 4/2015 |

\* cited by examiner

SUBSTRATE PROCESSING APPARATUS, SUBSTRATE PROCESSING METHOD AND STORAGE MEDIUM

CROSS-REFERENCE TO RELATED APPLICATION

This application claims the benefit of Japanese Patent Application No. 2016-021211, filed on Feb. 5, 2016, in the Japan Patent Office, the disclosure of which is incorporated herein in its entirety by reference.

TECHNICAL FIELD

The present disclosure relates to a technique of film-forming processing performed by revolving substrates while supplying process gases to the substrates.

BACKGROUND

In a process of manufacturing a semiconductor device, a film may be formed by performing atomic layer deposition (ALD) on a semiconductor wafer (hereinafter, referred to as "wafer"). As an apparatus for performing such ALD, for example, there has been known an apparatus in which a rotary table with a plurality of wafers placed thereon is rotated to revolve the wafers so that the wafers repeatedly pass through a process-gas supplying region arranged in a diametric direction of the rotary table.

In an apparatus for performing dry etching on a wafer, however, there may be a case where an etching rate is adjusted so that a concentric distribution around a central portion of the wafer is achieved. In that case, it is necessary to obtain a concentric film thickness distribution around the central portion of the wafer in a film-forming process for the wafer which is a pre-process of the dry etching. In the aforementioned apparatus in which the wafers are revolved, however, a film formed on the wafer tends to have a film thickness distribution around a central portion of the rotary table, resulting in a problem that it is difficult to obtain the concentric film thickness distribution around the central portion of the wafer.

Since the film thickness distribution formed on the wafer depends on a wafer temperature, a concentric film thickness distribution can be obtained by adjusting a temperature distribution of the wafer. In some related art, heating lamps are utilized in film-forming apparatuses in which wafers are revolved. Specifically, there are known a technique of modifying a thin film by heating a wafer to a temperature higher than a film forming temperature, a technique of densifying a reaction product by means of heating, and a technique of performing auxiliary heating to a temperature higher than a pyrolysis temperature of ozone gas. Further, it is also known to control a plurality of heating lamps such that an in-plane temperature difference does not occur. However, the aforementioned techniques are different from a configuration of the present disclosure.

SUMMARY

Some embodiments of the present disclosure provide to provide a technique capable of forming a desired temperature distribution on a substrate in an apparatus for performing a film-forming process in which substrates are revolved by means of a rotary table.

According to one embodiment of the present disclosure, there is provided a substrate processing apparatus that performs a film formation process on a substrate placed on one side of a rotary table in a vacuum container by revolving the substrate by means of the rotary table and supplying a process gas to a region on the rotary table where the substrate passes through, the substrate processing apparatus includes: a main heating mechanism configured to heat the substrate; an auxiliary heating mechanism installed to face the region on the rotary table where the substrate passes through and configured to adjust an intensity of a light irradiated from the auxiliary heating mechanism in an inward/outward direction of the rotary table so as to adjust a temperature distribution of the substrate by heating the substrate by irradiating the light in an absorption wavelength range of the substrate; a temperature measurement part configured to detect the temperature distribution of the substrate in the inward/outward direction of the rotary table; a position detection part configured to detect a position of the rotary table in a rotational direction of the rotary table; and a control part configured to control the intensity of the light irradiated from the auxiliary heating mechanism based on a temperature measurement data obtained by the temperature measurement part, a data corresponding to a target temperature distribution of the substrate, and a position detection value detected by the position detection part, when the substrate corresponding to the temperature measurement data passes through a region heated by the auxiliary heating mechanism.

According to another embodiment of the present disclosure, there is provided a substrate processing method using a substrate processing apparatus that performs a film formation process on a substrate placed on one side of a rotary table in a vacuum container by revolving the substrate by means of the rotary table and supplying a process gas to a region on the rotary table where the substrate passes through, wherein the substrate processing apparatus includes an auxiliary heating mechanism installed to face the region on the rotary table where the substrate passes through and configured to adjust an intensity of a light irradiated from the auxiliary heating mechanism in an inward/outward direction of the rotary table so as to adjust a temperature distribution of the substrate by heating the substrate by irradiating the light in an absorption wavelength range of the substrate. The method includes: heating the substrate by a main heating mechanism; detecting, by a temperature measurement part, the temperature distribution of the substrate in the inward/outward direction of the rotary table; detecting, by a position detection part, a position of the rotary table in a rotational direction of the rotary table; and controlling the intensity of the light irradiated from the auxiliary heating mechanism based on a temperature measurement data obtained by the temperature measurement part, a data corresponding to a target temperature distribution of the substrate, and a position detection value detected by the position detection part, when the substrate corresponding to the temperature measurement data passes through a region heated by the auxiliary heating mechanism.

According to yet another embodiment of the present disclosure, there is provided a non-transitory computer-readable storage medium storing a computer program for use in a substrate processing apparatus that performs a film formation process on a substrate placed on one side of a rotary table in a vacuum container by revolving the substrate by means of the rotary table and supplying a process gas to a region on the rotary table where the substrate passes through. The computer program includes a group of steps of executing the above-described substrate processing method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

One embodiment of a film-forming apparatus 1 to which a substrate processing apparatus of the present disclosure is applied will be described with reference to FIGS. 1 to 4. This film-forming apparatus 1 adjusts a temperature distribution of a wafer W to a desired form. For example, in order to form a concentric film thickness distribution in a plane of the wafer W that is a substrate, the film-forming apparatus 1 performs a film-forming process by forming a concentric temperature distribution in the plane of the wafer and then supplying process gases in a state where the temperature distribution is formed as such. More specifically, the concentric temperature distribution refers to a temperature distribution in which locations along a circumferential direction of the wafer W, which are equidistant from a center of the wafer W, have an identical or substantially identical temperature and locations along an inward/outward direction (radial direction) of the wafer W have different temperatures.

Figure 1:
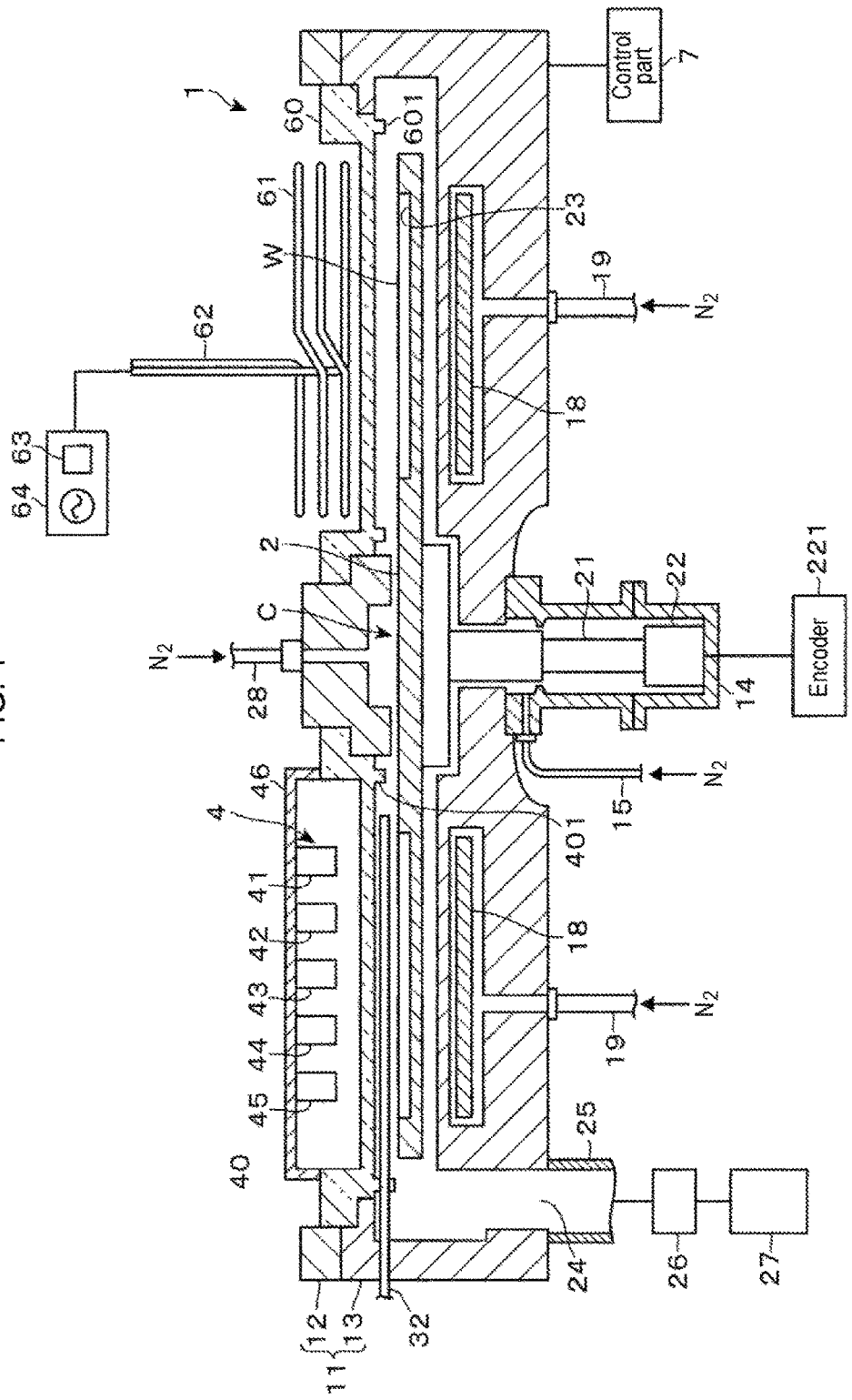
FIG. 1 is a longitudinal-sectional view illustrating one embodiment of a film-forming apparatus to which a substrate processing apparatus of the present disclosure is applied.
Figure 2:
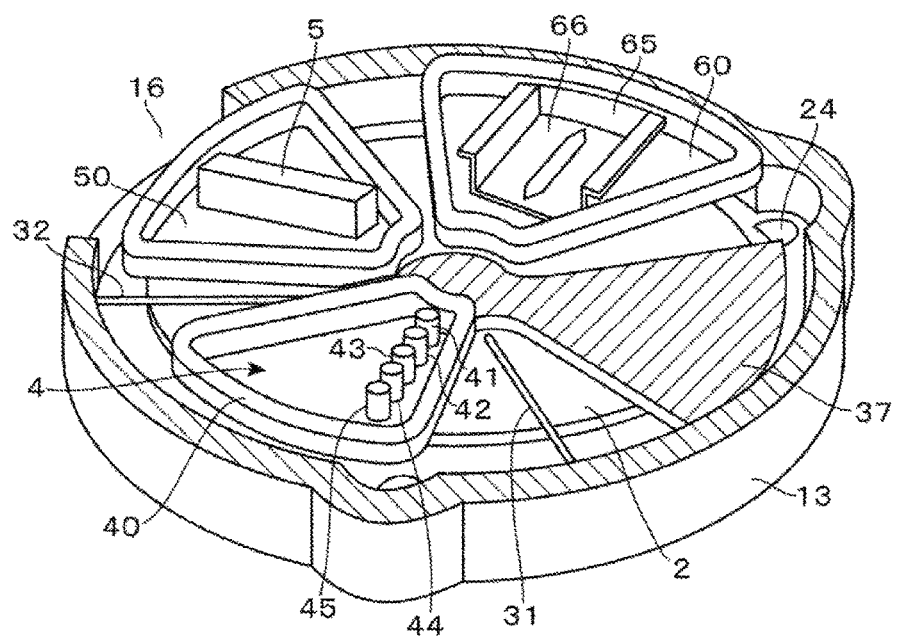
FIG. 2 is a schematic cross-sectional perspective view of the film-forming apparatus.
Figure 3:
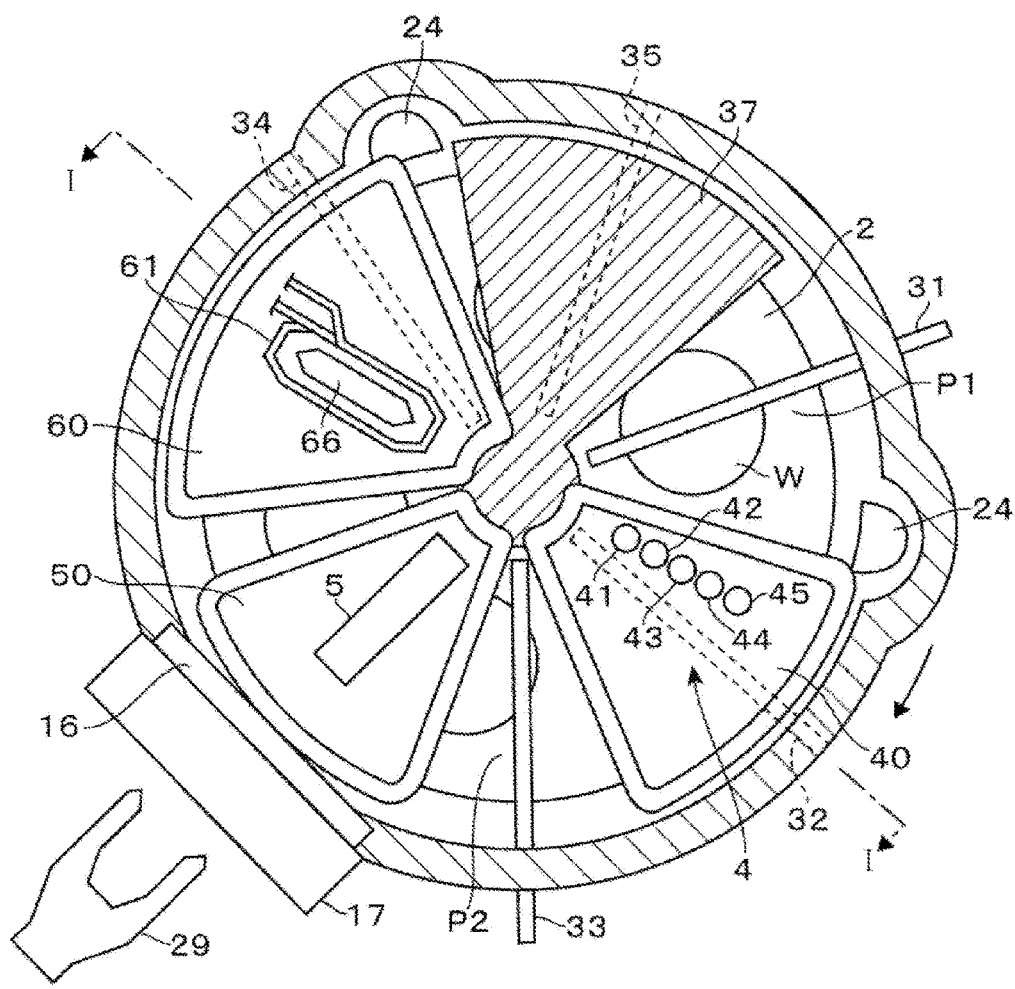
FIG. 3 is a cross-sectional plan view of the film-forming apparatus.
Figure 4:
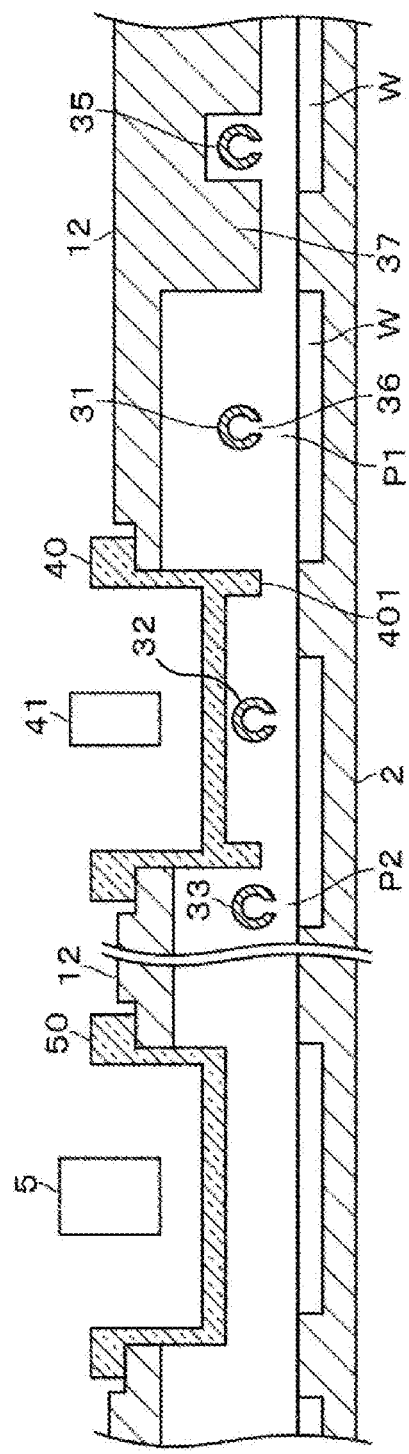
FIG. 4 is a longitudinal-sectional side view schematically showing a state where the film-forming apparatus is cut in a circumferential direction.

FIG. 1 is a longitudinal-sectional view of the film-forming apparatus 1, FIG. 2 is a schematic perspective view showing the interior of the film-forming apparatus 1, FIG. 3 is a cross-sectional plan view of the film-forming apparatus 1, and FIG. 4 is a longitudinal-sectional view schematically showing a state where the film-forming apparatus 1 is cut in the circumferential direction, wherein FIG. 1 is a longitudinal-sectional view taken along line I-I' of FIG. 3. The film-forming apparatus 1 has a substantially circular flat vacuum container (processing container) 11 and a disc-shaped horizontal rotary table 2 installed in the vacuum container 11. The vacuum container 11 is composed of a ceiling plate 12 and a container main body 13 defining a sidewall and a bottom of the vacuum container 11. Reference numeral 14 in FIG. 1 indicates a cover for plugging a central portion of the bottom of the container main body 13 and reference numeral 15 indicates a gas supplying pipe for supplying a purge gas, for example, $N_2$ (nitrogen) gas into the cover 14 during a film-forming process. A transfer port 16 for the wafer W is formed in the sidewall of the vacuum container 11 and configured to be opened and closed by a gate valve 17.

A central portion of a bottom of the rotary table 2 is connected to a rotation mechanism 22, which is provided in the cover 14, via a rotation shaft 21, so that the rotary table 2 is configured to be rotatable about a vertical axis. The rotation mechanism 22 is connected to an encoder 221 constituting a position detection part so as to detect a position of the rotary table 2 in a rotational direction. Hereinafter, a description will be continuously made by referring to the rotational direction of the rotary table 2 as "rotational direction" and referring to the position of the rotary table 2 in the rotational direction as "rotation position." For example, six circular recesses 23 are formed on a front surface side (one surface side) of the rotary table 2 at certain intervals along the rotational direction, and the wafers W are horizontally mounted on bottoms of the recesses 23. The mounted wafers W are revolved by the rotation of the rotary table 2 in a state where the positions of the wafers are regulated by sidewalls of the recesses 23.

A heater unit 18 constituting a main heating mechanism for heating the wafers W is provided below the rotary table 2 and configured to heat the wafer W to a film forming temperature of 200 to 800 degrees C. via the rotary table 2. In the space in which the heater unit 18 is disposed, purge gas supply pipes 19 for supplying a purge gas, for example, $N_2$ gas, are provided at a plurality of places in the circumferential direction. The wafer W placed on the rotary table 2 is heated by the heater unit 18 and an irradiation unit 4 to be described later to form a desired temperature distribution on the wafer W.

Above the rotary table 2, as shown in FIG. 3, a raw material gas nozzle 31, a separation gas nozzle 32, an oxidation gas nozzle 33, a plasma generating gas nozzle 34, and a separation gas nozzle 35, which are in the shape of a rod extending from an outer periphery to a center of the rotary table 2, are arranged in this order at certain intervals along the circumferential direction of the rotary table 2. As shown in FIG. 4, each of the nozzles 31 to 35 has a plurality of openings 36 arranged in a lower side thereof along a lengthwise direction such that gases are supplied along a diameter of the rotary table 2.

The raw material gas nozzle 31 discharges a Si (silicon)-containing gas, such as bis-(tertiary butyl amino)-silane (BTBAS), which is a process gas used for film formation. The oxidation gas nozzle 33 discharges an oxidation gas, such as a mixed gas of ozone ($O_3$) gas and oxygen ($O_2$) gas, for oxidizing the Si-containing gas. The separation gas nozzles 32 and 35 discharge a separation gas such as nitrogen ($N_2$) gas, and the plasma generating gas nozzle 34 discharges a mixed gas of argon (Ar) gas and oxygen (O2) gas.

A gas supply region below the raw material gas nozzle 31 is referred to as a first processing region P1, and a gas supply region below the oxidation gas nozzle 33 is referred to as a second processing region P2. The separation gas nozzles 32 and 35 are to form separation regions by which the first processing region P1 and the second processing region P2 are separated from each other. As for the separation gas nozzles 32 and 35, as shown in FIG. 4, a substantially fan-shaped protrusion 37 protruding downward is formed in a portion of the ceiling plate 12 above the separation gas nozzle 35. By supplying the separation gas from the separation gas nozzles 32 and 35, a space between the rotary table 2 and the protrusion 37 is configured as a separation region by which atmospheres of the processing regions P1 and P2 are separated from each other.

In this example, the irradiation unit 4 constituting an auxiliary heating mechanism is provided in the vicinity of above the separation gas nozzle 32. When viewed from the above, a fan-shaped opening is formed in, for example, a portion of the ceiling plate 12 above the separation gas nozzle 32. The opening is hermetically closed by a transmission member 40 made of a light-transmitting material such as quartz. The irradiation unit 4 is installed above the transmission member 40. This irradiation unit 4 is installed to irradiate a light having an absorption wavelength range of the wafer W so as to heat the wafer W and adjust the temperature distribution on the wafer W. The irradiation unit 4 is installed at a location laterally offset from above the separation gas nozzle 32 to prevent the irradiated light from being interfered by the separation gas nozzle 32.

Figure 5:
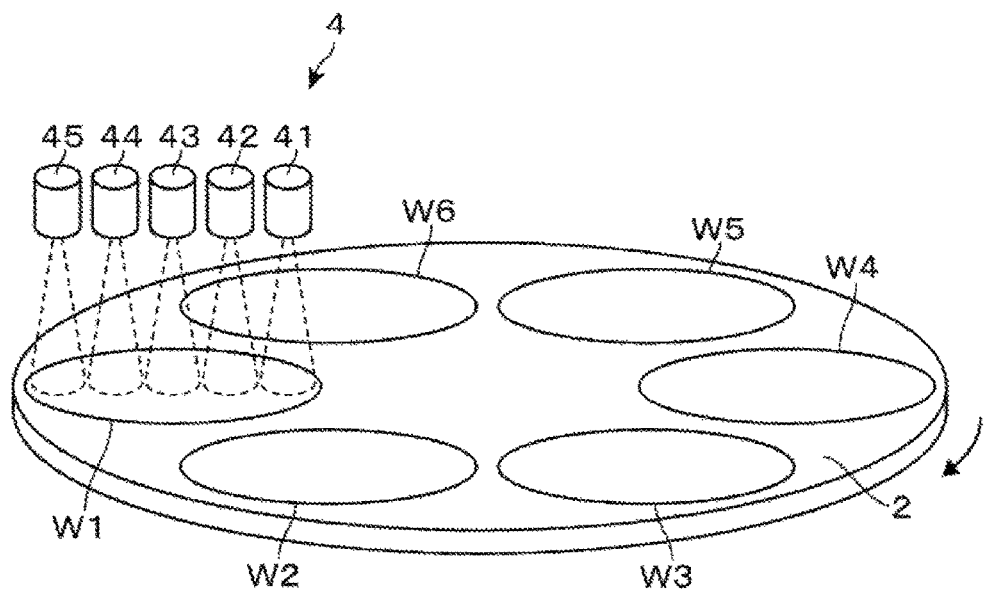
FIG. 5 is a schematic perspective view illustrating an irradiation unit provided in the film-forming apparatus.

The irradiation unit 4 in this example is composed of a plurality of, for example, five light-irradiating parts 41 to 45 which can independently adjust the light intensity, and theses light-irradiating parts 41 to 45 are arranged, for example, to be equidistantly spaced apart from one another in an inward/outward direction (radial direction) of the rotary table 2. As the light-irradiating parts 41 to 45, a laser emitter for emitting a laser light having a wavelength absorbed by the wafer W is used. The light-irradiating parts 41 to 45 finely adjust the temperature of the wafer W, for example, in a range of ±5 degrees C. with respect to a temperature obtained through the heating by the heater unit 18. As shown in FIG. 5, irradiation regions associated with the five light-irradiating parts 41 to 45 are set to cover the diameter of the wafer W, whereby the laser light irradiate entire surfaces of six wafers W1 to W6 placed on the rotary table 2 by the rotation of the rotary table 2. The regions irradiated with the laser light as such become regions heated by the irradiation unit 4. Reference numeral 46 in FIG. 1 indicates a supporting member for the light-irradiating parts 41 to 45.

Figure 6:
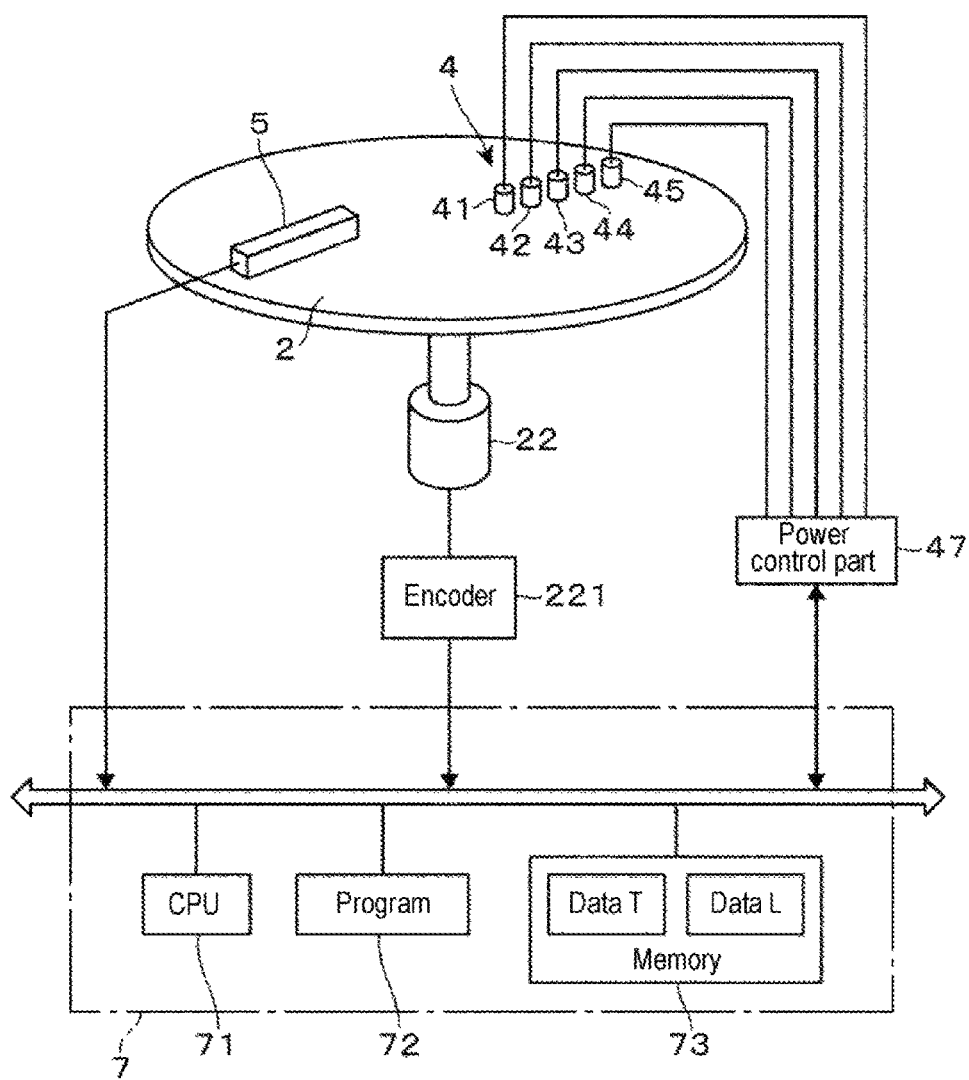
FIG. 6 is a schematic perspective view illustrating the irradiation unit, a temperature measurement part and a control part provided in the film-forming apparatus.

As shown in FIG. 6, each of the light-irradiating parts 41 to 45 is connected to a power control part 47 such that a power (supplying amount of power) is individually supplied based on a control signal from a control part 7 to be described later and the light intensity can be independently controlled. As will be described later, by controlling the supplying amount of power of each of the light-irradiating parts 41 to 45 to adjust an output of each of the light-irradiating parts 41 to 45, a desired temperature distribution, i.e., in this example, a mountain-shaped concentric temperature distribution in which the temperature of a region near the center of the wafer W is higher than that of a region near the outer periphery of the wafer W, is formed on the wafer W.

In the transmission member 40, for example, an outer peripheral edge portion in a lower face of the transmission member 40 vertically extends to form a protrusion 401 for regulating the gas. Due to this, when the separation gas is discharged from the separation gas nozzle 32, it is possible to prevent the raw material gas from being introduced from an upstream side in the rotational direction of the rotary table 2 and to prevent the oxidation gas from being introduced from a downstream side in the rotational direction of the rotary table 2, so that a space between the rotary table 2 and the protrusion 401 functions as a separation region for separating the atmospheres of the processing regions P1 and P2 from each other.

A temperature measurement part 5 is installed at a location spaced apart from the irradiation unit 4 in the circumferential direction of the rotary table 2, for example, in the vicinity of the transfer port 16 and above the rotary table 2, with a transmission member 50 made of, for example, quartz, interposed therebetween. For example, a thermo viewer (infrared thermal imaging device) is employed as the temperature measurement part 5. The temperature measurement part 5 is configured to detect the temperature distribution on the wafer W, for example, along the inward/outward direction of the rotary table 2 and to output a result of the detection to the control part 7 to be described later. The transmission member 50 in this example is configured in the same manner as the transmission member 40 described in the irradiation unit 4 except that no protrusion is formed thereon An antenna 61 formed by winding a metal wire into a coil shape is installed above the plasma generating gas nozzle 34 with a transmission member 60 made of, for example, a quartz, interposed therebetween. The antenna 61 is connected to a high frequency power source 64 via a connection electrode 62 and a matching device 63. The transmission member 60 in this example is configured in the same manner as the transmission member 40 described in the irradiation unit 4 and has a protrusion 601 formed in a lower face thereof for gas regulation. Reference numeral 65 indicates a Faraday shield and reference numeral 66 indicates a slit for delivering a magnetic field of an electromagnetic field generated from the antenna 61 to the wafer W. The Faraday shield 65 is omitted in FIG. 3.

At the bottom of the vacuum container 11, two evacuation ports 24 are formed at locations on an outer peripheral side in the inward/outward direction of the rotary table 2, and one end of an evacuation duct 25 is connected to each of the evacuation ports 24 as shown in FIG. 1. The other ends of the evacuation ducts 25 are joined to each other and connected to an evacuation mechanism 27, which is constituted by a vacuum pump, via an evacuation amount-adjusting part 26 including a valve. The evacuation amount from each of the evacuation ports 24 is adjusted by the evacuation amount-adjusting part 26, thereby adjusting the pressure in the vacuum container 11.

$N_2$ gas as a purge gas is supplied into a space above a central region C of the rotary table 2 through a gas supplying passage 28. This N₂ gas flows as the purge gas to the outer peripheral side in the inward/outward direction of rotary table 2. In this film-forming apparatus 1, the wafer W is transferred by an external transfer mechanism 29 to and from one of the recesses 23 placed at a location facing the transfer port 16. Holes are formed in the recess 23 to allow a plurality of lifting pins (now shown) for transferring the wafer W to be raised and lowered therethrough, and the delivery of the wafer W is performed by a cooperation of the lifting pins and the external transfer mechanism 29.

The control part 7 configured by a computer for controlling operations of the overall operations of the film-forming apparatus 1 is installed in the film-forming apparatus 1. As shown in FIG. 6, the control part 7 is equipped with a CPU 71, a program 72 for executing a film-forming process as will be described later, and a memory 73. The program 72 includes a group of steps for executing respective processes to be described later. The program 72 is installed from a storage medium such as a hard disc, a compact disc, an optical magnetic disc, a memory card, a flexible disc and the like into the control part 7.

Figure 7:
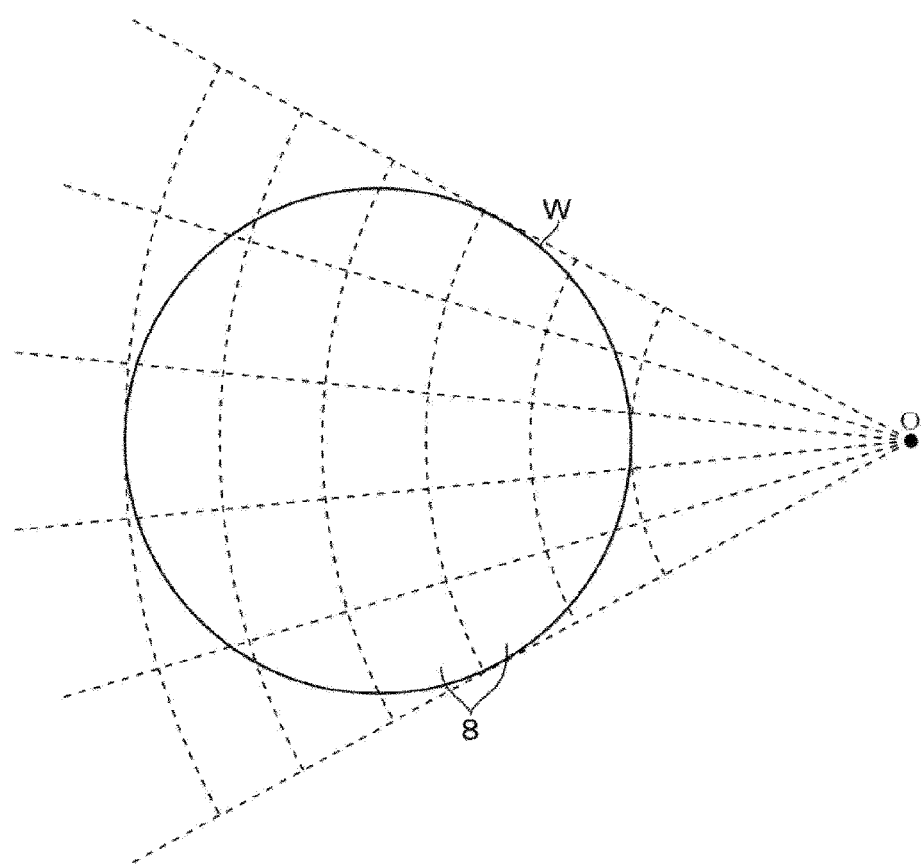
FIG. 7 is a plan view illustrating one example of divided regions of a wafer.

In addition, the control part 7 has a function of obtaining the temperature measurement data based on the temperature distribution data detected by the temperature measurement part 5 and storing the temperature measurement data in the memory 73. The temperature measurement data is, for example, data obtained by associating each of a plurality of divided regions divided along the inward/outward direction of the rotary table 2 (hereinafter, referred to as "inward/outward direction") with an evaluation value corresponding to the temperature. One example of the divided regions 8 is illustrated in FIG. 7. In this example, the wafer W is divided into five divided regions in the inward/outward direction and also divided into five divided regions in the rotational direction. Reference symbol "O" in FIG. 7 indicates a rotation center of the rotary table 2, and the five divided regions disposed in the inward/outward direction correspond to the irradiation regions associated with the light-irradiating parts 41 to 45 of the irradiation unit 4. In addition, the evaluation value is, for example, an average value of the temperatures of each of the divided regions obtained based on the temperature distribution detected by the temperature measurement part 5.

The control part 7 is configured to control the light intensity of the irradiation unit 4 when the wafer W corresponding to the temperature measurement data passes the region heated by the irradiation unit 4, based on the temperature measurement data, the data on a target temperature distribution on the wafer W, and a position detection value (a position of the rotary table 2 in the rotational direction). The data on the target temperature distribution of the wafer W is the data obtained by associating each of the plurality of divided regions 8 with a target value corresponding to a target temperature. A specific control method will be described below in conjunction with operations of the film-forming apparatus 1.

Next, operations performed by the film-forming apparatus 1 will be described. First, the entire internal space of the vacuum container 11 is heated by the heater unit 18. The gate valve 17 is then opened and the wafer W is transferred and mounted on the recess 23 by a cooperation of the raising and lowering of the lifting pins with an intermittent rotation of the rotary table 2 whenever the transfer mechanism 29 with the wafer W held therein enters the vacuum container 11. In this manner, the wafers W 1 to W 6 are accommodated in the six recesses 23, the transfer mechanism 29 is retreated from the vacuum container 11, and the gate valve 17 is then closed.

Thereafter, the internal space of the vacuum container 11 is adjusted to have a vacuum atmosphere of a predetermined pressure, and in parallel with this pressure adjustment, the wafer W is heated to a predetermined temperature, for example, 400 degrees C. though the rotary table 2 by the heater unit 18, and the rotary table 2 is then rotated, for example, at 200 rpm. Then, the temperature measurement part 5 sequentially detects the temperature distributions of the wafers W 1 to W 6, and acquires the temperature measurement data of each of the wafers W1 to W6. Subsequently, when the wafers W 1 to W 6 sequentially pass though the regions heated by the irradiation unit 4, the output of the irradiation unit 4 is controlled based on the temperature measurement data of each wafer. In this manner, an output of each of the light-irradiating parts 41 to 45 of the irradiation unit 4 is adjusted with respect to each of the wafers W1 to W 6 to perform a heating (finely-adjusted heating) of each wafer, thereby forming a desired temperature distribution on the wafer W.

Figure 8A:
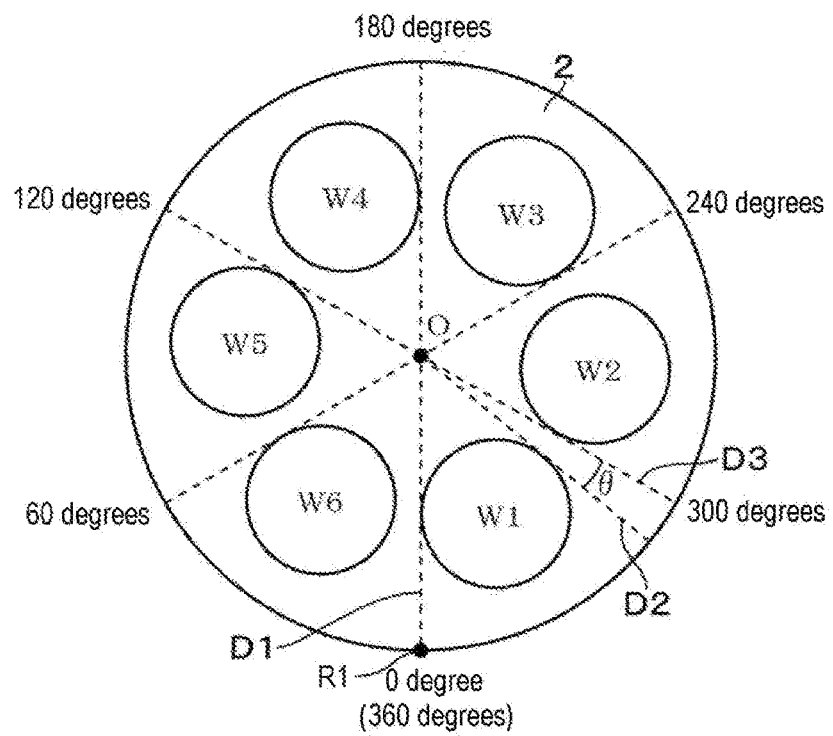
FIGS. 8A and 8B are schematic views illustrating operations of the film-forming apparatus.
Figure 8B:
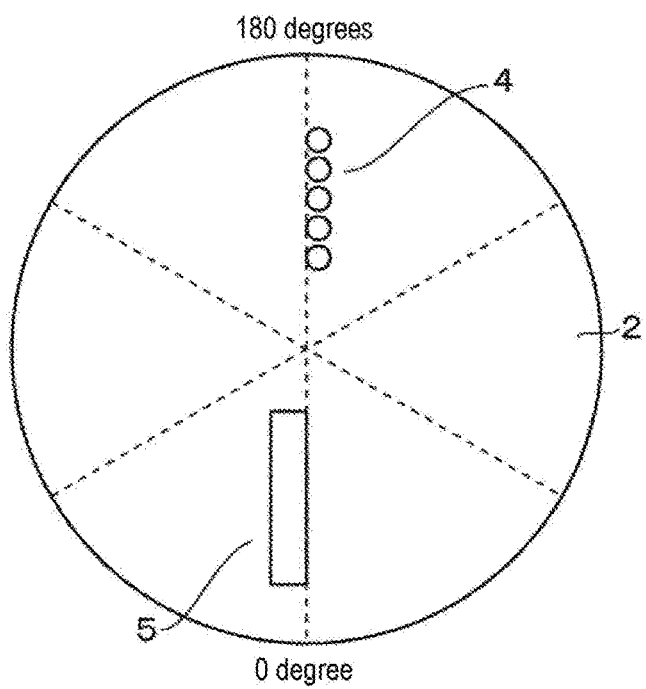

Hereinafter, the heating of the wafer W performed by the irradiation unit 4 will be described in detail with reference to FIGS. 8A to 10B. FIG. 8A is a schematic model for convenience of explanation and shows a state where the rotary table 2 is at a home position. This home position is a position where a reference position R1 on the outer peripheral edge of the rotary table 2 is at 0 degree. In addition, in this model, the temperature measurement part 5 is disposed at a position of 0 degree and the irradiation unit 4 is disposed at a position of 180 degree, as shown in FIG. 8B.

The rotary table 2 is rotated, for example, in the clockwise direction, and the wafers W1, W2, W3, W4, W5 and W6 are placed at positions of 0 degree, 300 degrees, 240 degrees, 180 degrees, 120 degrees and 60 degrees on the rotary table 2, respectively. The fact that the wafer W 1 is placed at the position of 0 degree indicates that a leading end of the wafer W 1 in the rotational direction is in contact with a line D1 connecting the center O and the position of 0 degree of the rotary table 2. Further, for example, when a line D2 connecting a trailing end of the wafer W1 in the rotational direction and the center O is drawn, an angle θ defined by the line D2 and a line D3 connecting the position of 300 degree and the center O of the rotary table 2 is set to be, for example, 5 degrees.

Figure 9A:
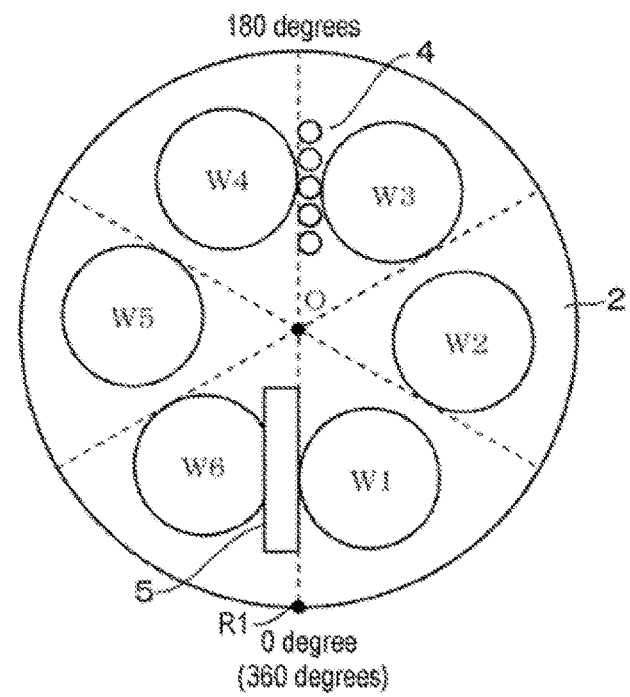
FIGS. 9A and 9B are schematic views illustrating operations of the film-forming apparatus.
Figure 9B:
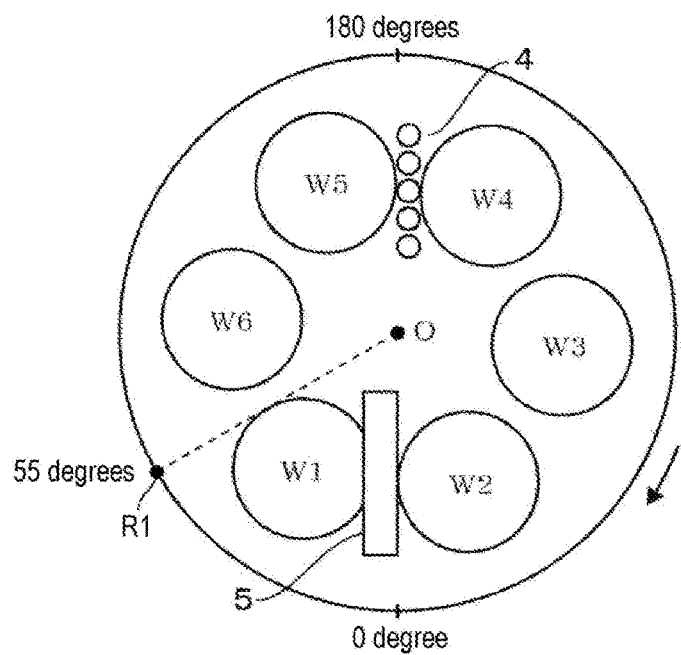

The acquisition of the temperature measurement data T is performed, for example, as follows. When the rotary table 2 located at the home position is rotated and the reference position R1 is placed, for example, at 175 degrees, the irradiation unit 4 is turned on with a preset irradiation pattern to start the heating (finely-adjusted heating) of the wafer W1. Then, when the rotary table 2 is rotated by one rotation, for example, and the reference position R1 is placed again at the position of 0 degree as shown in FIG. 9A, the temperature measurement part 5 starts the detection of the temperature distribution of the wafer W 1. In the temperature measurement part 5, the temperature distribution in the inward/outward direction on the wafer W 1 is detected, and the temperature distribution of the wafer W1 from the position of 0 degree to the position of 55 degrees is acquired until the reference position R1 reaches the position of 55 degree (a state shown in FIG. 9B). Then, the temperature measurement data T1 from the position of 0 degree to the position of 55 degrees is written in a data area for the wafer W 1 in the memory 73 of the control part 7.

Similarly, when the reference position R1 reaches the position of 60 degrees, the temperature measurement part 5 starts acquisition of the temperature distribution of the wafer W2, and the temperature measurement data T2 when the reference position R1 is between the position of 60 degrees and the position of 115 degrees is written in a data area for the wafer W2. In this manner, the temperature measurement data T3 when the reference position R1 is between the position of 120 degrees and the position of 175 degrees is written in a data area for the wafer W3, and the temperature measurement data T4 when the reference position R1 is between the position of 180 degrees and the position of 235 degrees is written in a data area for the wafer W4. Furthermore, the temperature measurement data T5 when the reference position R1 is between the position of 240 degrees and the position of 295 degrees is written in a data area for the wafer W5, and the temperature measurement data T6 when the reference position R1 is between the position of 300 degrees and the position of 355 degrees is written in a data area for the wafer W6.

Figure 10A:
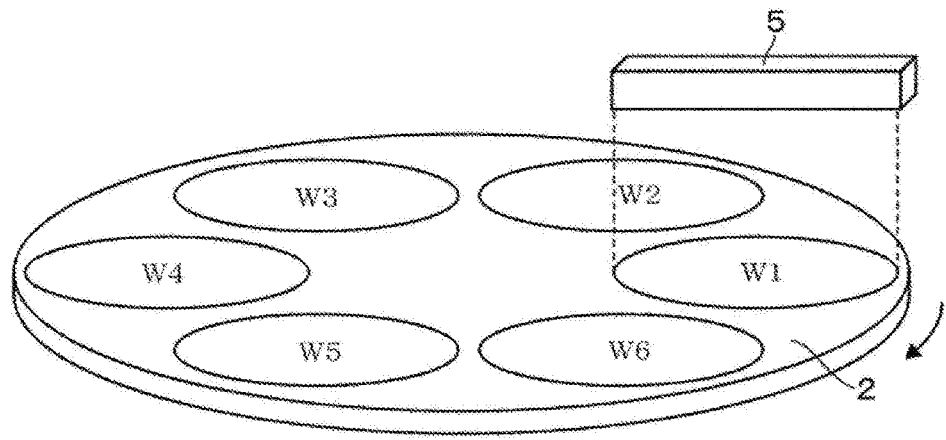
FIGS. 10A and 10B are schematic perspective views illustrating operations of the film-forming apparatus.
Figure 10B:
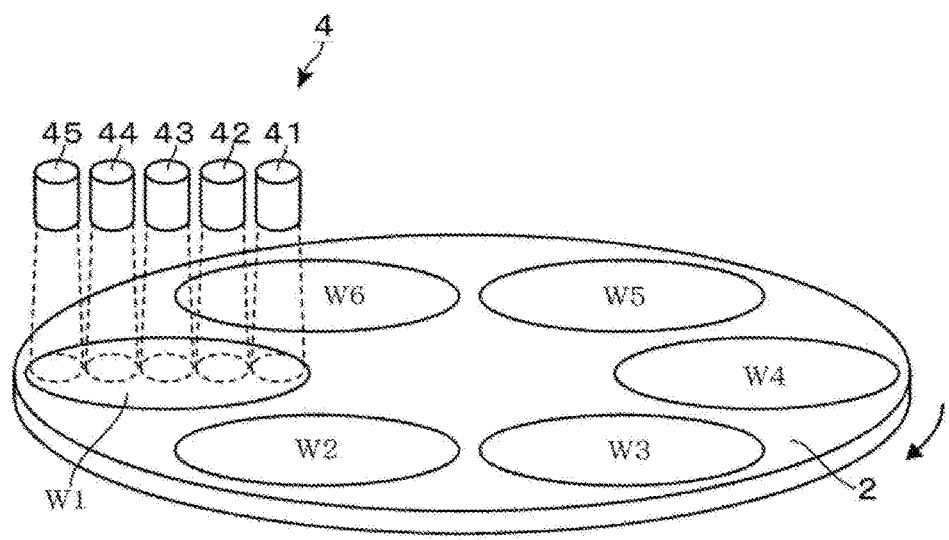

In addition, for example, when the wafer W1 of which the temperature measurement data T1 was acquired based on the temperature distribution detected by the temperature measurement part 5 as shown in FIG. 10A passes through the irradiation unit 4 as shown in FIG. 10B, the wafer W1 is heated according to light intensity data L1 prepared based on the temperature measurement data T1 of the wafer W1. The light intensity data L1 is the data prepared by associating the light intensities of the light-irradiating parts 41 to 45 of the irradiation unit 4 with the rotational position of the rotary table 2. For example, the light intensity data L1 is prepared based on comparison results between the temperature measurement data T1 and the target temperature distribution data corresponding to the target temperature distribution of the wafer W. The target temperature distribution data is a target value of the temperature of each of the divided regions 8 of the wafer W, for example, an average temperature value of the divided regions 8. The target temperature distribution in this example is a mountain-shaped concentric temperature distribution in which the temperature of a region near the center is higher than that of a region near the outer periphery of the wafer W.

The target temperature distribution data is stored, for example, in the memory 73 of the control part 7. A difference between the evaluation value and the target value of the temperature for each of the divided regions 8 of the wafer W is acquired. The light intensities of the light-irradiating parts 41 to 45 are determined to raise the temperature of each of the divided regions 8 of the wafer W by an amount corresponding to the difference through the heating performed by the light-irradiating parts 41 to 45, and light intensity data L is prepared. The light intensity data L is obtained, for example, by writing the outputs of the light-irradiating parts 41 to 45 for each of the divided regions 8. A relationship between the light intensities of the light-irradiating parts 41 to 45 and an amount of change in temperature is prepared in advance. The light intensities also include a case where the light intensity is zero. In this example, since the divided region on the outer peripheral side of the wafer W has an area larger than that of the divided region on the central side, the irradiation of light with the same output from the light irradiating parts 41 to 45 causes the degree of increase in temperature in the divided region of the outer peripheral side to be small. Therefore, the light intensity data L is prepared in consideration of, for example, a relationship between the amount of change in temperature and the amount of change in light intensity (output) for each of the light-irradiating parts 41 to 45.

In this manner, the light intensity data L1 is prepared from the temperature measurement data T1 of the wafer W1. When the reference position R1 is between the position of 180 degrees and the position of 235 degrees, the wafer W1 is irradiated with a laser beam having an output controlled based on the light intensity data L1, from each of the light-irradiating parts 41 to 45. Further, when the reference position R1 is between the position of 240 degrees and the position of 295 degrees, the wafer W2 is heated by controlling the output of the irradiation unit 4 based on light intensity data L2 prepared from the temperature measurement data T2 of the wafer W2. Likewise, when the reference position R1 is between the position of 300 degrees and the position of 355 degrees, between the position of 360 degrees (0 degree) and the position of 55 degrees, between the position of 60 degrees and the position of 155 degrees and between the position of 120 degrees and the position of 175 degrees, respectively, the wafers W3, W4, W5 and W6 are heated by controlling the output of the irradiation unit 4, respectively.

Thus, whenever the wafer W passes through the temperature measurement part 5 due to the rotation of the rotary table 2, the temperature distribution of the wafer W is detected to acquire the temperature measurement data T, and the light intensity of the irradiation unit 4 is controlled when the wafer W corresponding to this temperature measurement data T passes through the region heated by the irradiation unit 4. By continuously rotating the rotary table 2 in such a manner, the temperature distribution of the wafer W gradually approaches the target temperature distribution, i.e., the mountain-shaped concentric temperature distribution. The term "concentric temperature distribution" used herein includes a case where the temperature distribution from the central portion to the periphery of the wafer W is approximate to each other in the circumferential direction, and indicates a meaning wider than that of a general concentric circle. Although the foregoing has been described using the schematic model, the irradiation unit 4 and the temperature measurement part 5 are arranged appropriately in view of their designs, in practice.

Then, in a state where the concentric temperature distribution is formed on the wafer W, the rotary table 2 is rotated, for example, in the clockwise direction when viewed in a plan view. Further, $N_2$ gas is supplied at a predetermined flow rate from the separation gas nozzles 32 and 35 and the central region C; a silicon-containing gas, and $O_3$ gas and $O_2$ gas, for example, are supplied from raw material gas nozzle 31 and the oxidation gas nozzle 33, respectively; and Ar gas and $O_2$ gas are supplied from the plasma generating gas nozzle 34.

The wafer W on which the temperature distribution is formed alternately and repeatedly passes through the first processing region P1 below the raw material gas nozzle 31 and the second processing region P2 below the oxidation gas nozzle 33. Accordingly, a cycle including adsorption of the silicon-containing gas onto the wafer W and formation of a molecular layer of $SiO_2$ caused by oxidation of the adsorbed silicon-containing gas is repeatedly performed, thereby laminating the molecular layers. In addition, by supplying a high frequency power from the high frequency power source 64, the gas discharged from the plasma generating gas nozzle 34 is activated by a magnetic field so as to generate plasma, and the plasma collides with the surface of the wafer W. Thus, impurities are released from the molecular layer and element rearrangement occurs, so that refinement (densification) of the film is achieved.

While this atomic layer deposition (ALD) cycle is being performed, for example, the acquisition of the temperature measurement data T of the wafer W and the heating by the irradiation unit 4 under a state where the light intensity is controlled based on the temperature measurement data T are performed. In this manner, for example, the concentric temperature distribution in which the temperature on the central side of the wafer W is higher than that on the peripheral side is formed in the plane of the wafer W. Thus, the amount of adsorption of the silicon-containing gas on the central side of the wafer W is larger than that on the peripheral side thereof, whereby the thickness of the molecular layer of $SiO_2$ formed in one cycle is increased in the central side of the wafer W. By laminating such molecular layers as described above, a $SiO_2$ film having the concentric thickness distribution in which the film thickness in the center side is larger than that in the peripheral side is formed.

In the vacuum container 11, $N_2$ gas as the separation gas supplied to the separation region spreads in the circumferential direction of the separation region to prevent the raw material gas and the oxidation gas from being mixed on the rotary table 2. Further, $N_2$ gas supplied to the central region C is supplied to the outer side in the inward/outward direction of the rotary table 2, thereby preventing the raw material gas and the oxidation gas from being mixed in the central region C. When the aforementioned cycle is performed, $N_2$ gas is also supplied to an accommodation space for the heater unit 18 and to a back side of the rotary table 2 as described above so as to purge the raw material gas and the oxidation gas.

Thus, when respective portions in the plane of the wafer W have desired film thicknesses, the amounts of $N_2$ gas supplied to the separation gas nozzles 32 and 35 and the central region C is reduced, and the supply of the process gases from the gas nozzles 31 and 33 is stopped. Then, the heating of the wafer W by the heater unit 18 and the irradiation unit 4, the detection of the temperature distribution of the wafer W by the temperature measurement part 5, the supply of the high frequency power to the antenna 61, and the rotation of the rotary table 2 are stopped. Subsequently, after the elapse of a predetermined time, the gate valve 17 is opened and the wafers W are sequentially transferred to the transfer mechanism 29, which has entered the vacuum container 11, by the cooperation of the raising and lowering of the lifting pins with the intermittent rotation of the rotary table 2, so that the wafers W are unloaded from the vacuum container 11.

According to the film-forming apparatus 1, when the film-forming process is performed by supplying the process gases to the wafers W while the wafers W are revolved by the rotary table 2, the wafers W are heated by the heater unit 18 and auxiliarily heated by the irradiation unit 4 which can adjust the light intensity in the inward/outward direction of the rotary table 2. The irradiation unit 4 adjusts the light intensity in the inward/outward direction based on the temperature measurement data obtained by the detection of the temperature distribution on the wafer W in the inward/outward direction of the rotary table 2 using the temperature measurement part 5, the data corresponding to the target temperature distribution, and the position detection value in the rotational direction of the rotary table 2. For this reason, since a light having a light intensity controlled in the inward/outward direction of the rotary table 2 in association with the position of the wafer W in the rotational direction of the rotary table 2 is irradiated on the wafer W by the irradiation unit 4, the temperature of the wafer W in the inward/outward direction can be adjusted to the target temperature distribution. For example, it is possible to form the concentric temperature distribution. When the concentric temperature distribution is formed, for example, it is possible to achieve the concentric film thickness distribution as described above.

Moreover, since the temperature distribution is individually detected for the plurality of wafers W and the heating performed by the irradiation unit 4 is also individually performed for the wafers W, it is possible to finely adjust the temperature distribution for each of the wafers W, thereby adjusting the temperature distributions of all the wafers W placed on the rotary table 2 to the target temperature distribution. Further, when the detection of the temperature distribution and the heating performed by the irradiation unit 4 are carried out plural times for the same wafer W by rotating the rotary table 2, the temperature of the wafer W can be raised to a target value by performing the heating plural times. Thus, the temperature of the wafer W can be adjusted to the target temperature by using the irradiation unit 4 with a low output.

Figure 11:
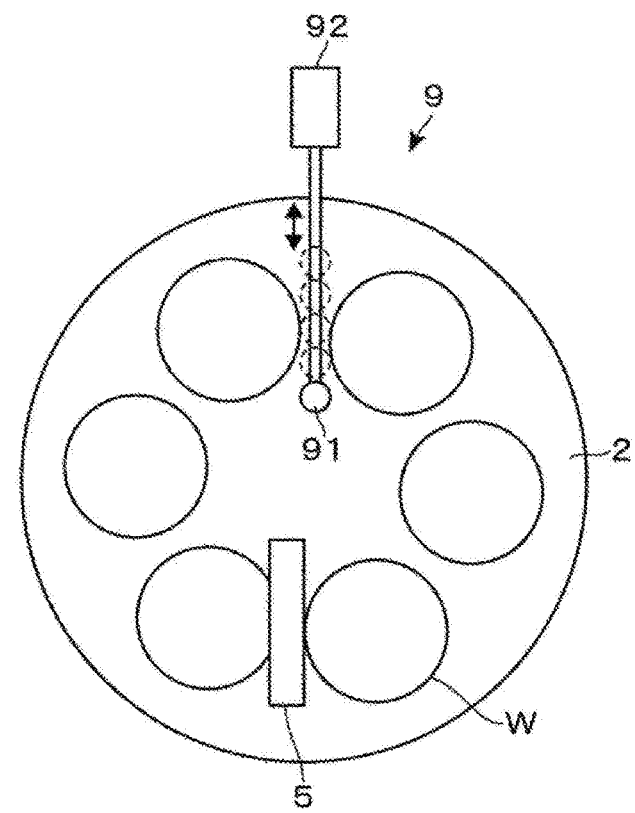
FIG. 11 is a plane view illustrating an irradiation unit according to another embodiment of the film-forming apparatus.

Subsequently, another embodiment of the present disclosure will be described. This embodiment differs from the aforementioned embodiment in that the auxiliary heating mechanism is configured by a light-irradiating part movable in the inward/outward direction of the rotation table 2. As shown in FIG. 11, an auxiliary heating mechanism 9 of this example has, for example, one light-irradiating part 91, and the light-irradiating part 91 is configured to be movable in the inward/outward direction by a movement mechanism 92. The other configuration is the same as that of the first embodiment.

For example, as shown in FIG. 11, the light-irradiating part 91 is sequentially placed at positions corresponding to five divided regions in the inward/outward direction by the movement mechanism 92. In this example, the temperature distributions of the wafers W1 to W6 are sequentially detected whenever the wafers W1 to W6 pass through the temperature measurement part 5 by the rotation of the rotary table 2 to acquire the temperature measurement data T of each of the wafers W1 to W6. For example, in a first rotation of the rotary table 2 after the start of temperature adjustment, the light-irradiating part 91 is disposed at the innermost position in the inward/outward direction so as to heat the wafers W1 to W6. In a second rotation, the light-irradiating part 91 is disposed at a second position from the innermost position in the inward/outward direction so as to heat the wafers W1 to W6. In this manner, by moving the light-irradiating part 91 in the inward/outward direction of the rotary table 2 at every rotation of the rotary table 2 to heat the wafers W1 to W6, the desired temperature distribution is formed on the wafers W1 to W6.

Figure 12:
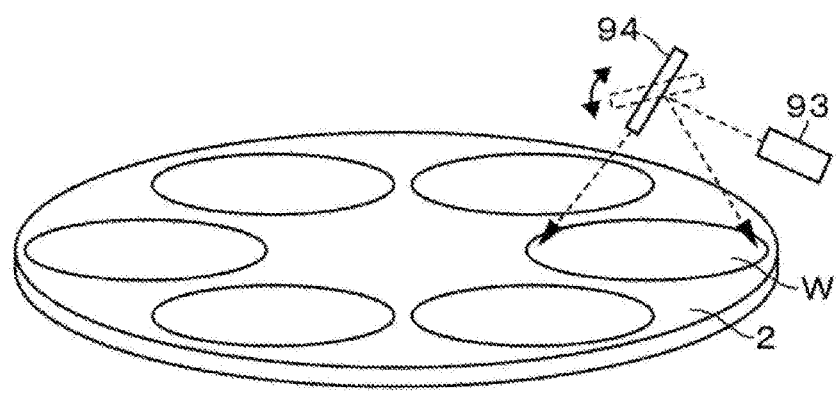
FIG. 12 is a schematic perspective view illustrating an irradiation unit according to still another embodiment of the film-forming apparatus.

Further, as shown in FIG. 12, for example, light from a light-irradiating part 93 may be reflected by a reflector part 94 to irradiate the wafers W with the light. In this example, the light-irradiating part 93 is fixedly installed and an angle of the reflector part 94 is adjusted such that the reflected light is sequentially irradiated onto the positions corresponding to, for example, the five divided regions in the inward/outward directions. In this example, similar to the example shown in FIG. 11, the angle of the reflector part 94 is adjusted at every rotation of the rotary table 2 to move the reflected light in the inward/outward direction of the rotary table 2 while heating the wafers W1 to W6, whereby the desired temperature distribution is formed on the wafers W1 to W6. However, the method described herein is presented by way of example only, and the shape of the light-irradiating part or the method of moving the light-irradiating part during the adjustment of the temperature can be appropriately selected.

The heating performed by the irradiation unit 4 is not limited to the aforementioned control method, as long as it is controlled based on the temperature measurement data obtained by the temperature measurement part 5, the data corresponding to the target temperature distribution, and the position detection value in the rotational direction of the rotary table 2. Furthermore, the shapes and installation locations of the irradiation unit 4 and the temperature measurement part 5 are not limited to those in the aforementioned example but may be appropriately selected as desired. The irradiation unit 4 and the temperature measurement part 5 may be installed in a region to which the raw material gas or the oxidation gas is supplied. Moreover, the temperature measurement part 5 may be installed at a location on an upstream side or a downstream side of the irradiation unit 4 in the rotational direction so far as the temperature measurement part 5 does not interfere with the irradiation of light from the irradiation unit 4. As for the shape of the irradiation unit 4, it may have any configuration if the light intensity in the inward/outward direction of the rotary table 2 can be controlled. In some embodiments, in order to suppress degradation of a resolution, an elongated light source by which an irradiation shape extends in the inward/outward direction of the rotary table 2 may be used. In a case where the auxiliary heating mechanism is formed by a plurality of light-irradiating parts, the number of the light-irradiating parts is not limited to the aforementioned example. A flash lamp may be employed as the light-irradiating parts of the irradiation unit 4 instead of a laser emitter.

Moreover, the temperature distribution formed on the wafer W is not necessarily limited to the concentric temperature distribution, and the concentric temperature distribution may include a bowl-shaped temperature distribution in which the temperature of a region closer to the center of the wafer W is lower than that of a region near the outer periphery. Further, the divided regions of the wafer are not limited to those described in the aforementioned example if they are a plurality of divided regions formed by dividing the wafer in the inward/outward direction of the rotary table.

The rotational speed of the rotary table 2 during the fine adjustment of the temperature of the wafer W by the irradiation unit 4 may be less than that during the ALD cycle. During the ALD cycle, the supply of power to the irradiation unit 4 may be stopped, and the interior of the vacuum container 11 may be heated by the heater unit 18 only. Further, a thermocouple or the like embedded in the rotary table 2 instead of the thermo viewer may be employed as the temperature measurement part 5. As in the configuration in which the light-irradiating part is installed around the temperature measurement part configured by the thermo viewer, the temperature measurement part may be formed integrally with the auxiliary heating mechanism. In addition, a configuration in which an optical path of the light-irradiating part overlaps with a photographing range of the thermo viewer by using a mirror or the like may be employed. In this case, for example, the detection of the temperature distribution of the wafer is performed by the temperature measurement part at a predetermined timing, and the auxiliary heating mechanism is subsequently controlled to irradiate the wafer with light having a light intensity based on the detected value. The irradiation timing of the light may be immediately after the detection of the temperature distribution of the wafer or when the wafer of which the temperature distribution was detected is placed below the auxiliary heating mechanism again by the rotation of the rotary table after the detection of the temperature distribution. For example, a method of irradiating the wafer W with the light in a first rotation, measuring the temperature of the wafer W in a second rotation, and controlling the light-irradiating part based on a result of the temperature measurement in a third rotation may be employed.

Although the formation of a $SiO_2$ film has been described as one example, a film formed on the wafer W is not limited to the $SiO_2$ film. For example, a titanium oxide ($TiO_2$) film may be formed by using titanium (Ti)-containing gas such as titanium methylpentanedionatobistetramethylheptanedionato (Ti(MPD)(THD)) gas as the raw material gas, instead of the silicon-containing gas, and ozone ($O_3$) gas as the oxidation gas. A mechanism for densifying the film by plasma is not necessarily required. Further, the present disclosure can be applied to adjustment of the amount of adsorption of processing gases onto a substrate depending on an in-plane temperature of the substrate. The present disclosure is not limited to an application to the film-forming apparatus for performing the film formation using the atomic layer deposition, but can be applied to an apparatus for performing film formation using a chemical vapor deposition (CVD). In addition, the present disclosure may be applied to a case in which a polygonal substrate is processed.

<Evaluation Test>

In the film-forming apparatus 1 described above, the irradiation unit was configured with two light-irradiating parts (laser emitters), i.e., a first light-irradiating part and a second light-irradiating part. The first light-irradiating part was disposed such that light is irradiated onto a region spaced by about 30 mm inwardly from an outer peripheral edge of the wafer W on the side of a central portion of the rotary table 2, the second light-irradiating part was disposed such that light is irradiated onto a central portion of the wafer W, and a temperature of the wafer W was detected by the temperature measurement part 5 configured by the thermo viewer. A rotational speed of the rotary table 2 was set to be 20 rpm, a pressure in the vacuum container 11 was set to be 260 Pa, the temperature of the wafer W was raised to 400 degrees C. by the heater unit 18, and then detection of the temperature by the temperature measurement part 5 was started.

Figure 13:
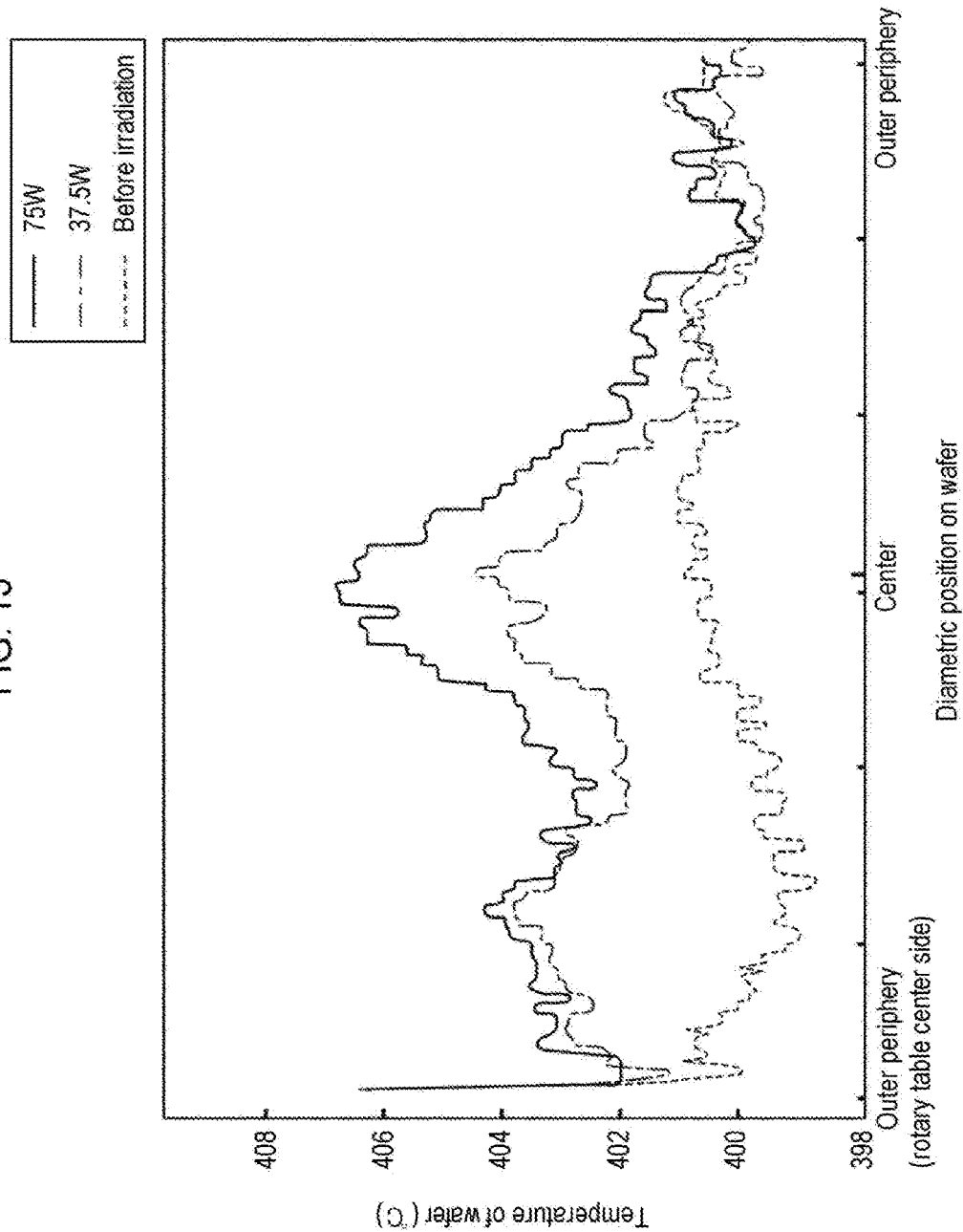
FIG. 13 is a graph showing results of evaluation tests.

Measurement results of the temperature of the wafer W are shown in FIG. 13. In FIG. 13, the vertical axis indicates the temperature of the wafer W, and the horizontal axis indicates a diametric position on the wafer W. Furthermore, a dashed line represents data before the heating by the light-irradiating parts is started, a one-dotted line indicates data when an output of the second light-irradiating part is 37.5 watts, and a solid line indicates data when the output of the second light-irradiating part is 75 watts. An output of the first light-irradiating part is 30 watts.

As a result, it was confirmed that the temperature distribution of the wafer W was changed by the first and second light-irradiating parts and that the temperature distribution could be adjusted by changing the output of the second light irradiating part. Accordingly, it is understood that a desired temperature distribution can be formed by controlling the number or installation positions and outputs of the light-irradiating parts. In addition, it was also confirmed that a temperature adjustment of +6 degrees C. could be achieved on the wafer W having 400 degrees C. by the output of 75 watts. Thus, it was recognized that the irradiation of light heats the wafer W and fine heating is effective for the temperature control.

According to the present disclosure in some embodiments, in the film-forming process in which the substrate is revolved by means of the rotation of the rotary table while supplying the process gases to the substrate to form a film on the substrate, the substrate is heated by a main heating mechanism and further by light from an auxiliary heating mechanism. The auxiliary heating mechanism is configured to be capable of adjusting a light intensity in the inward/outward direction of the rotary table. The light intensity is controlled based on the temperature measurement data obtained by the temperature measurement part for detecting a temperature distribution on the substrate in the inward/outward direction of the rotary table, the data corresponding to a target temperature distribution, and a position detection value in the rotational direction of the rotary table. Accordingly, the temperature distribution of the substrate is adjusted so that a desired temperature distribution can be formed.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus that performs a film formation process on a substrate placed on one side of a rotary table in a vacuum container by revolving the substrate by means of the rotary table and supplying a process gas to a region on the rotary table where the substrate passes through, the substrate processing apparatus comprising:
    a main heating mechanism configured to heat the substrate;
    an auxiliary heating mechanism installed to face the region on the rotary table where the substrate passes through, and configured to adjust an intensity of a light irradiated from the auxiliary heating mechanism in an inward/outward direction of the rotary table so as to adjust a temperature distribution of the substrate by heating the substrate by irradiating the light in an absorption wavelength range of the substrate;
    a temperature measurement part configured to detect the temperature distribution of the substrate in the inward/outward direction of the rotary table;
    a position detection part configured to detect a position of the rotary table in a rotational direction of the rotary table; and
    a control part configured to control the intensity of the light irradiated from the auxiliary heating mechanism based on a temperature measurement data obtained by the temperature measurement part, a data corresponding to a target temperature distribution of the substrate, and a position detection value detected by the position detection part, when the substrate corresponding to the temperature measurement data passes through a region heated by the auxiliary heating mechanism.

2. The substrate processing apparatus of claim 1, wherein the temperature measurement part is installed at a position spaced apart from the auxiliary heating mechanism in a circumferential direction of the rotary table.

3. The substrate processing apparatus of claim 1, wherein the auxiliary heating mechanism comprises a plurality of light-irradiating parts disposed along the inward/outward direction of the rotary table and configured to independently control light intensities of the light-irradiating parts.

4. The substrate processing apparatus of claim 1, wherein the auxiliary heating mechanism comprises a light-irradiating part configured to allow light irradiated from the light-irradiating part to be moved in the inward/outward direction of the rotary table.

5. The substrate processing apparatus of claim 4, wherein the light-irradiating part is movable in the inward/outward direction of the rotary table.

6. The substrate processing apparatus of claim 1, wherein the temperature measurement data is data obtained by associating each of a plurality of divided regions of the substrate divided in the inward/outward direction of the rotary table with an evaluation value corresponding to a temperature of each of the plurality of divided regions, and the data corresponding to the target temperature distribution of the substrate is data obtained by associating each of the plurality of divided regions with a target value corresponding to a target temperature.

7. The substrate processing apparatus of claim 1, wherein the target temperature distribution of the substrate is a distribution in which a temperature of a region near a center of the substrate differs from that of a region near an outer periphery of the substrate.

8. A substrate processing method using a substrate processing apparatus that performs a film formation process on a substrate placed on one side of a rotary table in a vacuum container by revolving the substrate by means of the rotary table and supplying a process gas to a region on the rotary table where the substrate passes through, wherein the substrate processing apparatus includes an auxiliary heating mechanism installed to face the region on the rotary table where the substrate passes through and configured to adjust an intensity of a light irradiated from the auxiliary heating mechanism in an inward/outward direction of the rotary table so as to adjust a temperature distribution of the substrate by heating the substrate by irradiating the light in an absorption wavelength range of the substrate, the method comprising:
    heating the substrate by a main heating mechanism;
    detecting, by a temperature measurement part, the temperature distribution of the substrate in the inward/outward direction of the rotary table;
    detecting, by a position detection part, a position of the rotary table in a rotational direction of the rotary table; and
    controlling the intensity of the light irradiated from the auxiliary heating mechanism based on a temperature measurement data obtained by the temperature measurement part, a data corresponding to a target temperature distribution of the substrate, and a position detection value detected by the position detection part, when the substrate corresponding to the temperature measurement data passes through a region heated by the auxiliary heating mechanism.

9. The substrate processing method of claim 8, wherein the temperature measurement data is data obtained by associating each of a plurality of divided regions of the substrate divided in the inward/outward direction of the rotary table with an evaluation value corresponding to a temperature of each of the plurality of divided regions, and the data corresponding to the target temperature distribution of the substrate is data obtained by associating each of the plurality of divided regions with a target value corresponding to a target temperature.

10. A non-transitory computer-readable storage medium storing a computer program for use in a substrate processing apparatus that performs a film formation process on a substrate placed on one side of a rotary table in a vacuum container by revolving the substrate by means of the rotary table and supplying a process gas to a region on the rotary table where the substrate passes through, wherein the computer program includes a group of steps of executing the substrate processing method of claim 8.

\* \* \* \* \*